United States Patent
Saenger et al.

(10) Patent No.: US 9,442,385 B2
(45) Date of Patent: Sep. 13, 2016

(54) OPTICAL SYSTEM FOR A MICROLITHOGRAPHIC PROJECTION EXPOSURE APPARATUS AND MICROLITHOGRAPHIC EXPOSURE METHOD

(71) Applicant: Carl Zeiss SMT GmbH, Oberkochen (DE)

(72) Inventors: Ingo Saenger, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 64 days.

(21) Appl. No.: 14/297,375

(22) Filed: Jun. 5, 2014

(65) Prior Publication Data

US 2014/0285788 A1   Sep. 25, 2014

Related U.S. Application Data (63) Continuation of application No. PCT/EP2012/075122, filed on Dec. 11, 2012.

(60) Provisional application No. 61/585,666, filed on Jan. 12, 2012.

(30) Foreign Application Priority Data

Jan. 12, 2012   (DE) .......................... 10 2012 200 371

(51) Int. Cl.
   *G03F 7/20*   (2006.01)

(52) U.S. Cl.
   CPC ....... *G03F 7/70191* (2013.01); *G03F 7/70108* (2013.01); *G03F 7/70566* (2013.01)

(58) Field of Classification Search
   CPC .......... G03F 7/70566; G03F 7/70308; G03F 7/70191; G02B 27/286
   See application file for complete search history.

(56) References Cited

U.S. PATENT DOCUMENTS

| | | |
|---|---|---|
| 6,392,800 B2 | 5/2002 | Schuster |
| 7,940,375 B2 | 5/2011 | Fiolka et al. |

(Continued)

FOREIGN PATENT DOCUMENTS

| | | |
|---|---|---|
| DE | 10 2007 007 907 A1 | 8/2008 |
| DE | 10 2010 029 339 A1 | 12/2011 |

(Continued)

OTHER PUBLICATIONS

German Office Action, with translation thereof, for corresponding DE Appl No. 10 2012 200 371.1, dated Aug. 7, 2012.

(Continued)

*Primary Examiner* — Michelle M Iacoletti
(74) *Attorney, Agent, or Firm* — Fish & Richardson P.C.

(57) ABSTRACT

The invention relates to an optical system for a microlithographic projection exposure apparatus, and to a microlithographic exposure method. An optical system for a microlithographic projection exposure apparatus comprises a polarization-influencing optical arrangement, wherein the polarization-influencing optical arrangement comprises at least one first array of first polarization-influencing elements and a second array of second polarization-influencing elements, wherein the first and second arrays are arranged successively in the light propogation direction, wherein the first and second polarization-influencing elements in each case have a birefringence that is dependent on the presence of an electric field, and wherein the first polarization-influencing elements and the second polarization-influencing elements are transverse Pockels cells.

17 Claims, 8 Drawing Sheets

(56) References Cited

U.S. PATENT DOCUMENTS

| | | |
|---|---|---|
| 2005/0078293 A1 | 4/2005 | Mackey et al. |
| 2005/0146704 A1 | 7/2005 | Gruner et al. |
| 2008/0013065 A1 | 1/2008 | Kohl |
| 2008/0192223 A1 | 8/2008 | Volkenandt et al. |
| 2009/0279066 A1 | 11/2009 | Tinnemans et al. |
| 2013/0077077 A1 | 3/2013 | Saenger et al. |

FOREIGN PATENT DOCUMENTS

| | | |
|---|---|---|
| EP | 2 117 034 A1 | 11/2009 |
| JP | 2007-515768 A | 6/2007 |
| JP | 2007-180088 A | 7/2007 |
| JP | 2008-060546 A | 3/2008 |
| JP | 2009-272624 A | 11/2009 |
| WO | WO 2005/026843 A2 | 3/2005 |
| WO | WO 2005/069081 A2 | 7/2005 |
| WO | WO 2005/085955 A2 | 9/2005 |
| WO | WO 2009/100862 A1 | 8/2009 |
| WO | WO 2011/154227 | 12/2011 |

OTHER PUBLICATIONS

Tom Milster et al., "Polarization holograms for source-mask optimization"; SPIE Advanced Lithography; Paper 7973-45; Mar. 3, 2011; College of Optical Sciences—The University of Arizona; pp. 1-23.

International Preliminary Report on Patentability for PCT/EP2012/075122, dated Jul. 24, 2014.

International Search Report and Written Opinion for corresponding PCT Appl No. PCT/EP2012/075122, dated Apr. 24, 2013.

Japanese Office Action, with translation thereof, for JP Application No. JP2014-551547 dated May 22, 2015.

OPTICAL SYSTEM FOR A MICROLITHOGRAPHIC PROJECTION EXPOSURE APPARATUS AND MICROLITHOGRAPHIC EXPOSURE METHOD

CROSS REFERENCE TO RELATED APPLICATIONS

This application is a continuation of, and claims benefit under 35 USC 120 to, international application PCT/EP2012/075122, filed Dec. 11, 2012, which claims priority of German Patent Application DE 10 2012 200 371.1 and U.S. 61/585,666, both filed on Jan. 12, 2012. The content of these applications is hereby incorporated by reference.

BACKGROUND OF THE INVENTION

1. Field of the Invention

The invention relates to an optical system for a microlithographic projection exposure apparatus, and to a microlithographic exposure method.

2. State of the Art

Microlithographic projection exposure apparatuses are used for producing microstructured components, such as, for example, integrated circuits or LCDs. Such a projection exposure apparatus comprises an illumination device and a projection lens. In the microlithography process, the image of a mask (=reticle) illuminated with the aid of the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

During the operation of a microlithographic projection exposure apparatus, there is a need to set defined illumination settings, i.e. intensity distributions in a pupil plane of the illumination device, in a targeted manner. Alongside the use of diffractive optical elements (so-called DOEs), the use of mirror arrangements is also known for this purpose, e.g. from WO 2005/026843 A2.

Such mirror arrangements comprise a multiplicity of micromirrors that can be set independently of one another.

Furthermore, it is known from WO 2009/100862 A1 both to set different illumination settings with regard to the polarization distribution by temporal correlation between, firstly, a device for changing the polarization state, such as e.g. a Pockels cell or Kerr cell, and, secondly, a mirror arrangement comprising mirror elements that can be set independently of one another, the mirror arrangement being situated in the illumination device, and to realize an electronic changeover between such differently polarized illumination settings.

SUMMARY OF THE INVENTION

A problem addressed by the present invention is that of providing an optical system for a microlithographic projection exposure apparatus and a microlithographic exposure method which enable a flexible setting of different polarization distributions even without the need for such a mirror arrangement.

This problem is solved in accordance with the features of the independent claims.

An optical system according to the invention for a microlithographic projection exposure apparatus comprises:

a polarization-influencing optical arrangement;

wherein the polarization-influencing optical arrangement comprises at least one first array of first polarization-influencing elements and a second array of second polarization-influencing elements, wherein the first and second arrays are arranged successively in the light propogation direction;

wherein the first and second polarization-influencing elements in each case have a birefringence that is dependent on the presence of an electric field; and wherein the first polarization-influencing elements and the second polarization-influencing elements are transverse Pockels cells.

The approach according to the invention makes it possible, in particular, to realize the flexible setting of different polarization states even in an illumination device comprising a zoom axicon system, which does not comprise a mirror arrangement having mirror elements that can be set independently of one another (i.e. a so-called MMA), that is to say even in such an illumination device to make the polarization "switchable" in so far as the polarization distribution is also freely selectable in addition to an arbitrary intensity distribution ("freeform distribution") in the pupil plane (such as can be set via a suitable diffractive optical element, "DOE" for short). The changeover, according to the invention, of the polarization state can be combined in particular with a DOE changer in order to set different polarized illumination settings which differ from one another with regard to the intensity and/or polarization distribution.

Even though the invention can be realized advantageously in particular in systems without a mirror arrangement having mirror elements that can be set independently of one another (=MMA), the invention is not restricted thereto, and so, in principle, the present application also encompasses the use in conjunction with an illumination device comprising such a mirror arrangement (MMA).

Within the meaning of the present application, an "array" of polarization-influencing elements should be understood to be an arrangement which is constructed from at least four polarization-influencing elements, wherein in each of two mutually perpendicular spatial directions within the plane of this arrangement, in each case at least two of the polarization-influencing elements are arranged adjacent to one another. In this case, the "array" is not restricted to periodic or equidistant arrangements, i.e. the manipulator elements succeeding one another in each of the two spatial directions (e.g. x- and y-directions) can be configured in principle arbitrarily (that is to say also aperiodically) with regard to the maximum extent of the polarization-influencing elements. Furthermore, the individual polarization-influencing elements can have a square, rectangular, hexagonal or else other suitable geometry with regard to their optically used active surface. On the other hand, the polarization-influencing elements can also be arranged (partly or wholly) periodically with regard to their extent in at least one of the mutually perpendicular spatial directions.

Even though each of the arrays is constructed from at least four polarization-influencing elements, the number of polarization-influencing elements within each array is typically significantly greater and can be merely by way of example 100 (e.g. in a 10*10 grid arrangement) or even hundreds. In this case, the number of polarization-influencing elements within each array can be chosen depending on the illumination setting respectively to be produced.

In accordance with the disclosure, the first and second polarization-influencing elements are transverse Pockels cells. In transverse Pockels cells, the electric field is applied perpendicularly to the light propagation direction, such that there is no need for any passage of light through the electrodes used for generating the electric field (and thus also no need for a transparent configuration of the electrodes). A further advantage of the use of transverse Pockels cells is the in this case lower electrical voltage required for producing a predetermined retardation (of e.g. lambda/2, wherein lambda denotes the operating wavelength). Thus, the electrical voltage required for producing a retardation of Lambda/2 in the case of a transverse Pockels cell composed of potassium dihydrogen phosphate (KDP, $KH_2PO_4$) is approximately 220 V, whereas the voltage in the case of longitudinal Pockels cells can have e.g. values in the kilovolts (kV) range.

The disclosure is not restricted to the use of transverse Pockels cells, and so, in principle, longitudinal Pockels cells can also be used. Furthermore, instead of a Pockels cell, it is also possible to use Kerr cells as polarization-influencing elements, wherein the Kerr cells, likewise via the variation of an externally applied electric field, enable a controllable modulation of the polarization of the light passing through (wherein, in the case of the Kerr cell, the induced birefringence is not linearly proportional to the applied electric field, as in the case of a Pockels cell, but rather has a quadratic dependence on the applied electric field). Generally, the disclosure also relates to an optical system for a microlithographic projection exposure apparatus, comprising a polarization-influencing optical arrangement;
wherein the polarization-influencing optical arrangement comprises at least one first array of first polarization-influencing elements and a second array of second polarization-influencing elements, wherein the first and second arrays are arranged successively in the light propogation direction; and
wherein the first and second polarization-influencing elements in each case have a birefringence that is dependent on the presence of an electric field.

In accordance with one embodiment, the polarization-influencing optical arrangement comprises a plurality of electrodes for generating the electric field, wherein the electrodes are arranged on in each case mutually opposite sides of the first polarization-influencing elements and of the second polarization-influencing elements.

In accordance with one embodiment, the electrodes in the first array are oriented at a finite angle relative to the electrodes in the second array.

In accordance with one embodiment, the polarization-influencing optical arrangement comprises, for the individual polarization-influencing elements, in each case at least two electrode pairs which are assigned to different pairs of mutually opposite sides of the respective polarization-influencing element.

In accordance with one embodiment, an electrical voltage can be applied to the electrode pairs in each case independently of one another.

In accordance with one embodiment, fast axes of the birefringence that can be induced in the first polarization-influencing elements of the first array and fast axes of the birefringence that can be induced in the second polarization-influencing elements of the second array, respectively, are oriented at a finite angle with respect to one another, particularly at an angle of 45°±5°.

For this purpose, the first array and/or the second array can firstly be configured such that the respective first and second polarization-influencing elements are tilted relative to one another, such that the mutually corresponding sides of the polarization-influencing elements in the first array and in the second array—and thus also the corresponding positions for the arrangement of the electrodes—are also at an angle with respect to one another.

Alternatively, however, even given an identical orientation of the first and second arrays, it is possible merely to select different pairs of opposite sides of the polarization-influencing elements in the first and second arrays for the positioning of electrodes in order in this way to realize a desired angle between the fast axes in the first polarization-influencing elements and the fast axes in the second polarization-influencing elements. The last-mentioned configuration has the advantage that, firstly, it is possible to minimize a loss of intensity on account of ray shading effects and, secondly, it is also possible to prevent undesired effects of a ray transfer into respectively adjacent polarization-influencing elements in the second array and thus, under certain circumstances, an undesired deviation in the influencing of the polarization state respectively obtained.

In accordance with one embodiment, the first array and/or the second array in each case have/has a hexagonal arrangement of polarization-influencing elements. Firstly, such a hexagonal arrangement enables the available area to be filled particularly densely with Pockels cells. Secondly, in such a configuration it becomes possible, for example, to realize preferred arrangements of the electrodes present for generating the electric field at the respective Pockels cells such that the electrodes are to a first approximation parallel to the sides of the individual Pockels cells (i.e. form only a small angle of a few degrees with them), since in the hexagonal arrangement the sides of the individual Pockels cells in each case run at an angle of 30°. Specifically, one preferred arrangement of the electrodes present for generating the electric field at the respective Pockels cells is precisely to arrange the electrodes in the two arrays at angles of ±22.5° with respect to the preferred direction of polarization of the impinging light (i.e. at an angle of 45° with respect to one another), since then—as explained in even greater detail below—different polarization states can be set in a particularly advantageous manner (namely in a "45° quantization"). The Pockels cells are then operated virtually as lambda/2 plates, wherein the polarization-influencing effect of the Pockels cell corresponds to a mirroring of the preferred direction of polarization at the fast axis of the birefringence. Consequently, a rotation of the preferred direction of polarization by 45° is obtained precisely in the case of an orientation of the fast axis of the birefringence (and thus the orientation of the electrodes present for generating the electric field at the respective Pockels cell) at 22.5° with respect to the preferred direction of polarization of the impinging light.

The configuration described above allows—as also described below—for example (as a merely exemplary use) the conversion of a constantly linear input polarization into a quasi-tangential polarization distribution or a quasi-radial polarization distribution. Furthermore, any other polarization distributions desired can be set in the pupil plane.

In accordance with one embodiment, the polarization-influencing optical arrangement is arranged in a pupil plane of the optical system. Via the arrangement according to the invention, the polarization can be switched separately for a multiplicity of different regions in the pupil plane (corresponding to the number of Pockels cells present within an array).

In accordance with one embodiment, the polarization-influencing optical arrangement can produce, for each of a multiplicity of channels running through the arrangement, in a manner dependent on whether or not a predefined electrical voltage is present at the polarization-influencing element situated in the region of the respective channel, different (in particular four different) polarization rotation angles for linearly polarized light passing through. The polarization rotation angles can be in particular in each case an integral multiple of 45°.

In accordance with one embodiment, via selectively applying a predefined electrical voltage to the polarization-influencing elements, a constantly linear polarization distribution of light passing through the optical system can be converted into a quasi-tangential or quasi-radial polarization distribution. In this case, a "tangential polarization distribution" is generally understood to be a polarization distribution for which the oscillation direction of the electric field strength vector runs perpendicular to the radius directed to the optical system axis. The term "quasi-tangential polarization distribution" is accordingly employed when the above condition is met approximately or for individual regions in the relevant plane (e.g. pupil plane). Accordingly, a "radial polarization distribution" is generally understood to be a polarization distribution for which the oscillation direction of the electric field strength vector runs parallel to the radius directed to the optical system axis. Accordingly, the term "quasi-radial polarization distribution" is employed when the above condition is met approximately or for individual regions in the relevant plane.

In accordance with one embodiment, the optical system comprises a diffractive optical element.

In accordance with one embodiment, the polarization-influencing optical arrangement comprises at least three arrays of polarization-influencing elements.

The invention furthermore relates to a microlithographic projection exposure apparatus, and to a microlithographic exposure method.

Further configurations of the invention can be gathered from the description and from the dependent claims. The invention is explained in greater detail below on the basis of exemplary embodiments illustrated in the accompanying drawings.

DETAILED DESCRIPTION OF PREFERRED EMBODIMENTS

Figure 6:
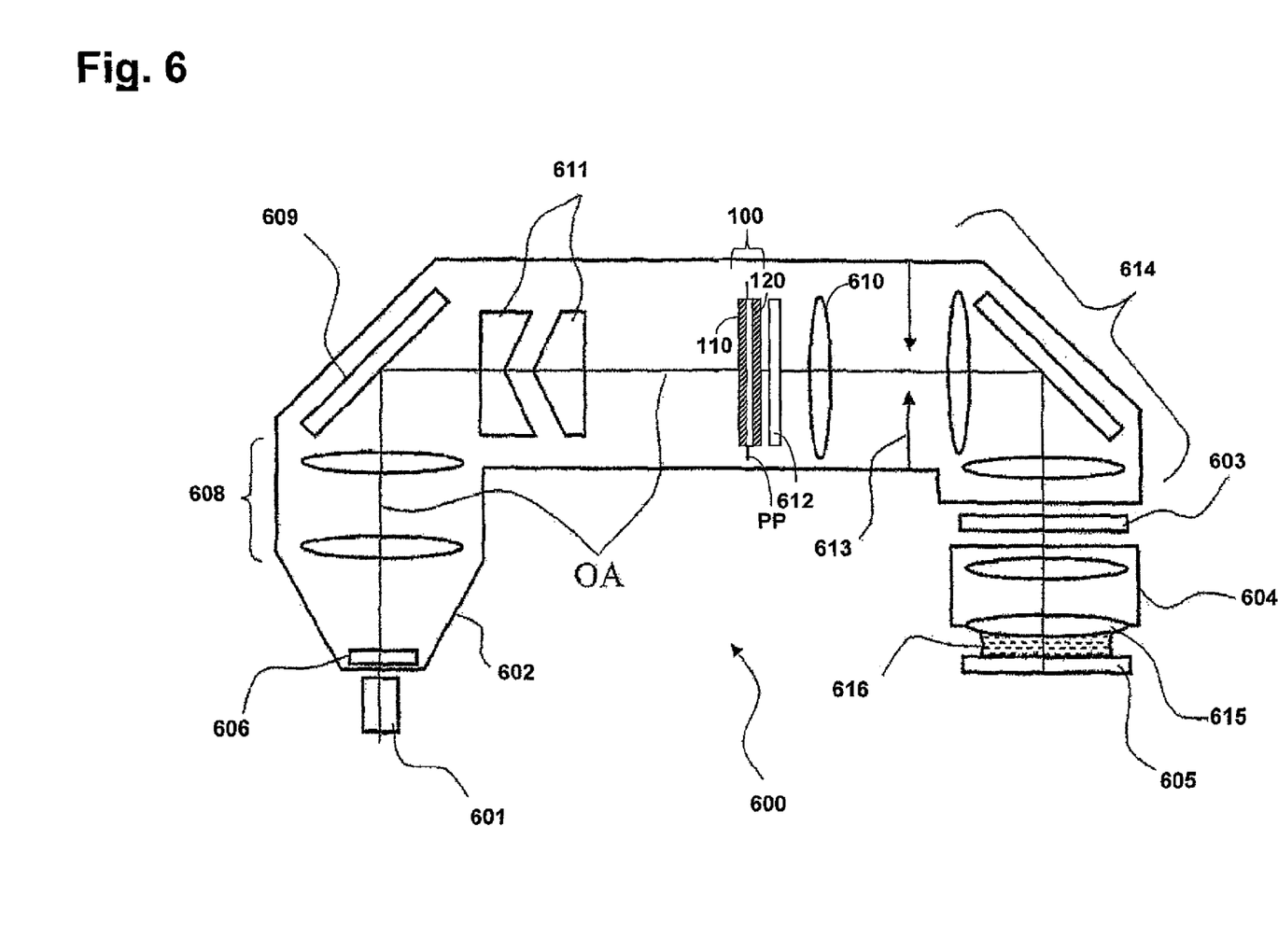
FIG. 6 shows a schematic illustration of the construction of a microlithographic projection exposure apparatus.

Firstly, the basic construction of a microlithographic projection exposure apparatus is explained below with reference to FIG. 6 in a simplified schematic illustration.

The microlithographic projection exposure apparatus 600 comprises a light source unit 601, an illumination device 602, a structure-bearing mask 603, a projection lens 604 and a substrate 605 to be exposed. The light source unit 601 can comprise as light source for example an ArF laser for an operating wavelength of 193 nm, and also a ray shaping optical unit, which generates a parallel light beam. A parallel light beam emitted by the light source unit 601 firstly impinges on a diffractive optical element (DOE) 606. The DOE 606 produces a desired intensity distribution, e.g. dipole or quadrupole distribution, via an angular emission characteristic defined by the respective diffractive surface structure in a pupil plane PP.

A lens 608 disposed downstream of the DOE 606 in the beam path is designed as a zoom lens that generates a parallel light beam having a variable diameter. The parallel light beam is directed onto an axicon 611 by a deflection mirror 609. Via the zoom lens 608 in conjunction with the upstream DOE 606 and the axicon 611, different illumination configurations are produced in the pupil plane PP depending on the zoom setting and position of the axicon elements. A polarization-influencing optical arrangement 100 is situated in the pupil plane PP in accordance with FIG. 6, the construction of the optical arrangement being explained below with reference to FIG. 1 et seq.

The illumination device 602 furthermore comprises downstream of the axicon 611 a light mixing system 612 arranged in the region of the pupil plane PP (directly downstream thereof in FIG. 6), which light mixing system can comprise e.g. an arrangement of micro-optical elements suitable for achieving light mixing.

The light mixing system 612 and, if appropriate, further optical components (indicated merely by an individual lens element 610) are followed by a reticle masking system (REMA) 613, which is imaged onto the reticle 603 by a REMA lens 614 and thereby delimits the illuminated region on the reticle 603. The reticle 603 is imaged onto the light-sensitive substrate 605 via the projection lens 604. In the example illustrated, an immersion liquid 616 having a refractive index different from that of air is situated between a last optical element 615 of the projection lens 604 and the light-sensitive substrate 605.

The construction and functioning of the polarization-influencing optical arrangement 100 situated in the pupil plane PP in accordance with FIG. 6 will now be explained below with reference to FIG. 1 et seq.

Figure 1A:
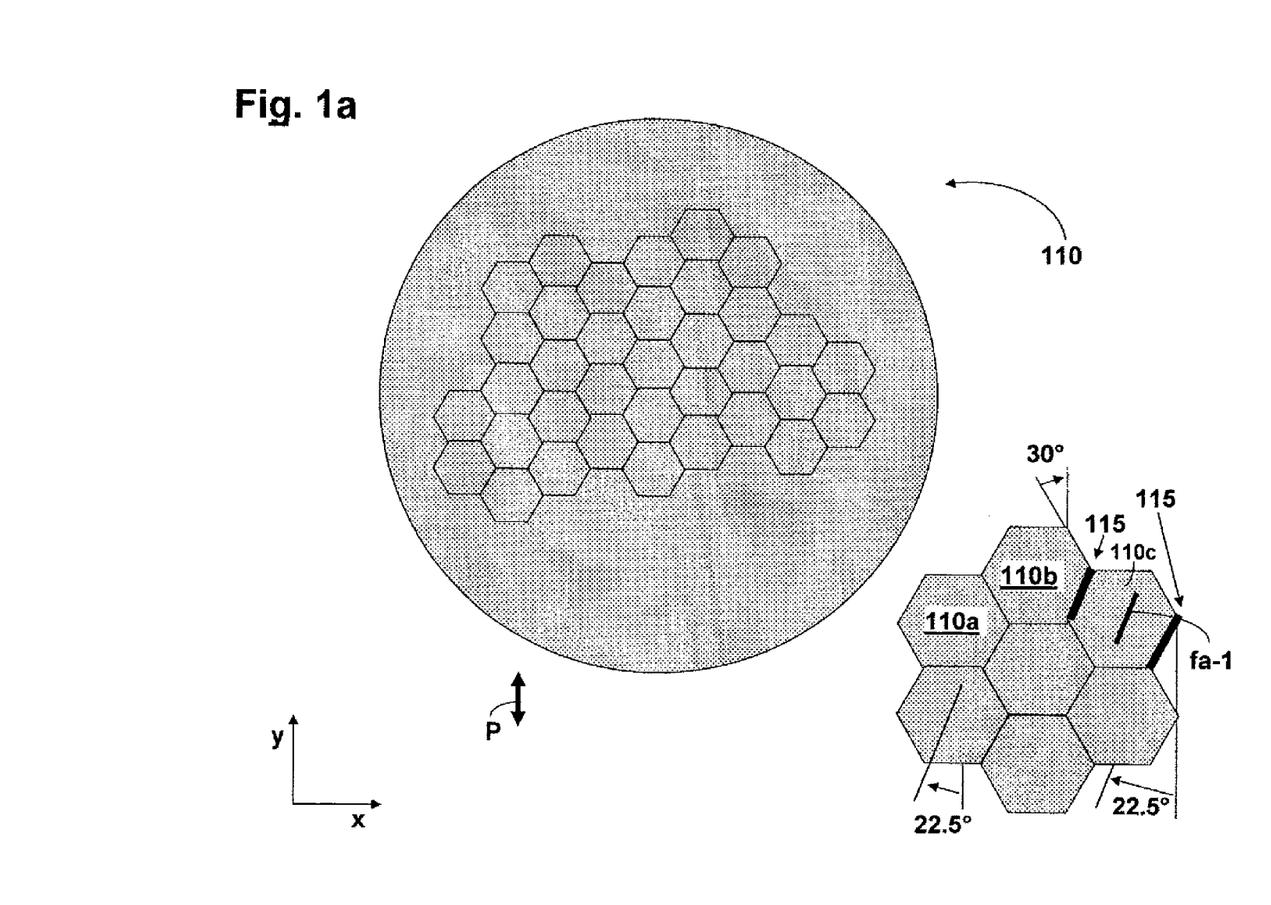
FIGS. 1a-1b, 2a-2b, 3-5 show schematic illustrations for elucidating the construction and the functioning of embodiments of the present invention.
Figure 1B:
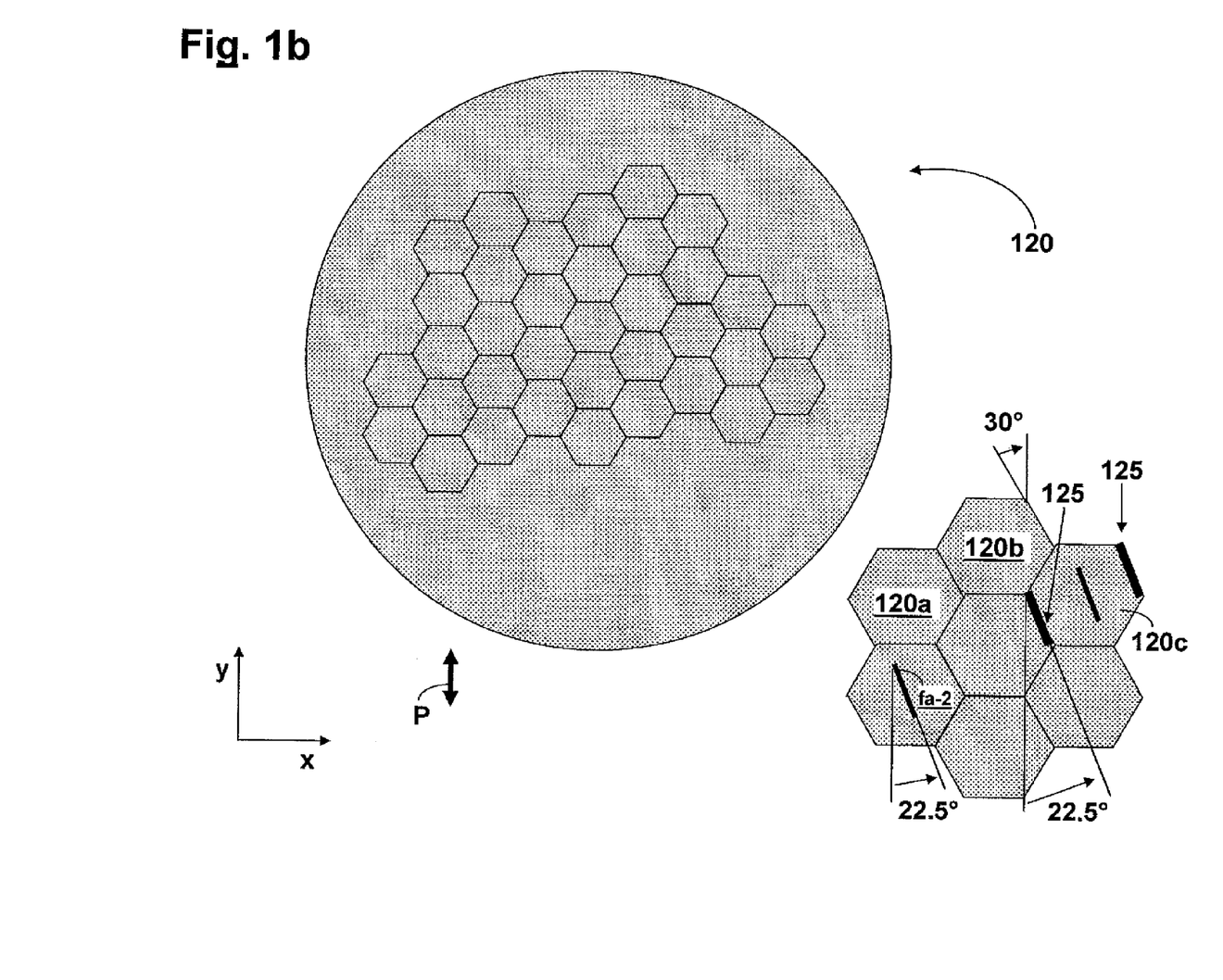

In accordance with FIG. 1a-b, the polarization-influencing optical arrangement 100 comprises a first array 110 and a second array 120, each comprising an—in the exemplary embodiment hexagonal—arrangement of polarization-influencing elements in the form of Pockels cells 110a, 110b, 110c, . . . and 120a, 120b, 120c, . . . respectively. The Pockels cells are produced from a suitable crystal material having sufficient transmission at the operating wavelength (e.g. approximately 193 nm or approximately 157 nm), wherein they enable a manipulation of the polarization on account of the linear proportionality of the birefringence present in the crystal material with respect to the externally applied electric field. Non-linear optical crystals such as e.g. potassium dihydrogen phosphate (KDP, $KH_2PO_4$) or barium beta borate (BBO) are suitable as material.

Figure 2A:
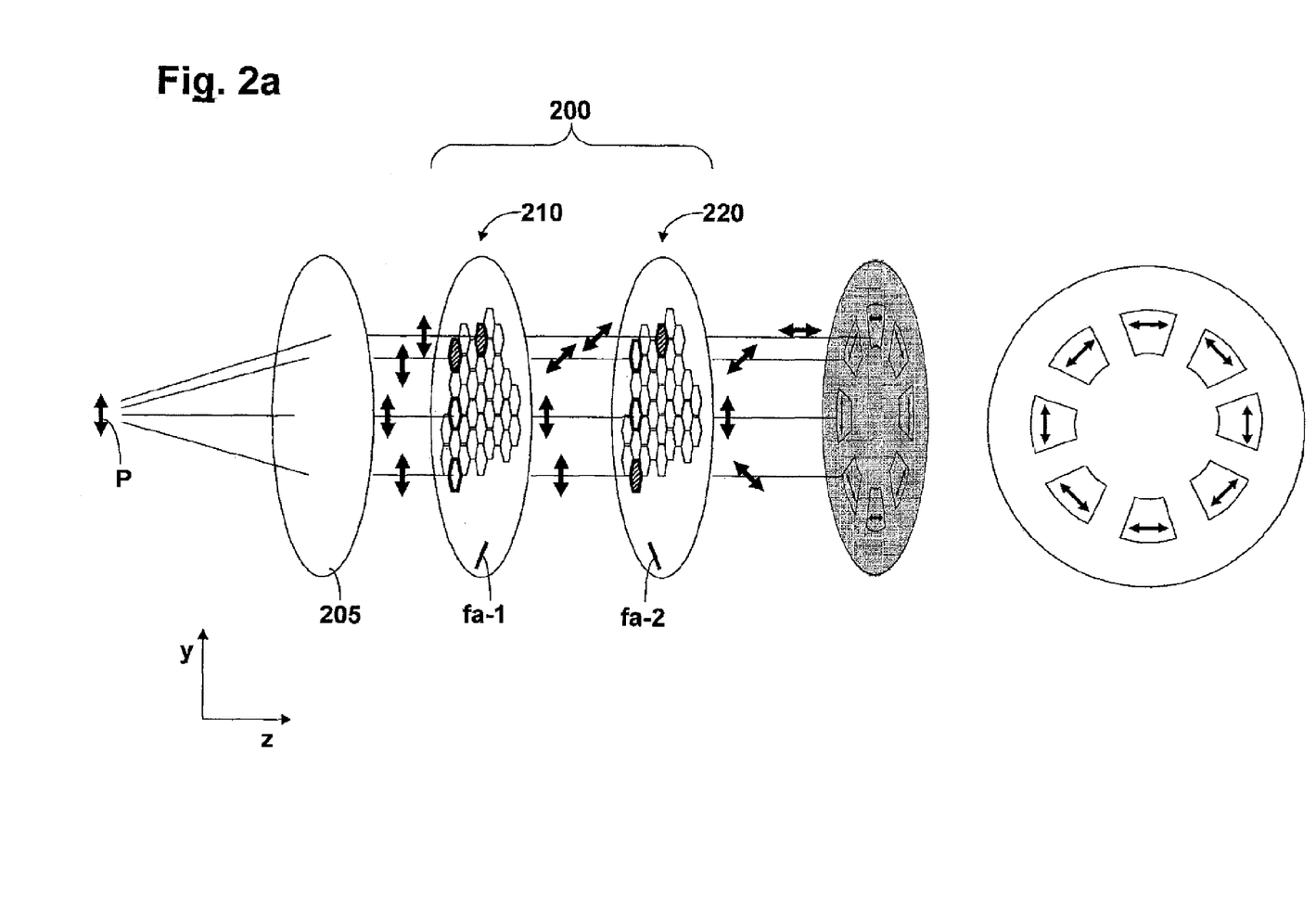

In accordance with FIG. 2a, the schematic illustration shows how the polarization-influencing optical arrangement according to the invention can be used for producing an illumination setting with quasi-tangential polarization distribution in the pupil plane. In this case, the Pockels cells to which electrical voltage is respectively applied in the first and second arrays are illustrated in a hatched manner, while exactly no electrical voltage is applied to the rest of the Pockels cells in the exemplary embodiment.

In the concrete exemplary embodiment, the Pockels cells of the first array 110 to which electrical voltage is applied have an orientation of the fast axis (designated by "fa-1") of the birefringence at +22.5° with respect to the y-direction or with respect to the preferred direction of polarization (indicated by the double-headed arrow "P" in FIG. 1 et seq.) of the light impinging on the polarization-influencing optical arrangement 100, and the Pockels cells of the second array 120 have an orientation of the fast axis (designated by "fa-2") of the birefringence at −22.5° with respect to the y-direction.

Table 1 lists for this example in the far right-hand column the polarization rotation angles respectively obtained for linearly polarized light impinging on the polarization-influencing optical arrangement 100 within a channel (formed by mutually assigned Pockels cells of the first array 110 and of the second array 120) in dependence on the voltage state of the Pockels cells in the first array 110 (left-hand column) and second (right-hand column) array 120. In this case, in the "on state" an electrical voltage is present at the relevant Pockels cell, whereas in the "off state" no electrical voltage is present at the Pockels cell.

TABLE 1

| Pockels cell in array 110 | Pockels cell in array 120 | Polarization rotation angles |
|---|---|---|
| off | off | 0° (vertical) |
| on | off | 45° |
| on | on | 90° (horizontal) |
| off | on | −45° |

As can be seen from Table 1, depending on the choice of the voltage state of the relevant Pockels cells from the first and second arrays 110, 120 in accordance with the switching possibilities indicated in Table 1 for each of the channels provided by the first and second arrays 110, 120, it is possible to set exactly the polarization rotation angles of 0°, ±45° and 90°, whereby in turn, as likewise indicated in FIG. 2, a quasi-tangential polarization distribution can be set in the pupil plane PP. In further embodiments of the invention, using more than two arrays and using the principle described above, it is possible to set smaller "polarization quantizations" (in the sense of realizing polarization rotation angles corresponding to an integral multiple of an angle of less than 45°).

In the arrangement in FIG. 2a, in this case the intensity distribution itself is produced via a diffractive optical element (DOE) (situated in the left-hand region; not depicted). Situated in direct proximity to the pupil plane is a so-called field-defining element (=FDE) e.g. in the form of an arrangement of micro-optical elements, which spans the field. An optical system e.g. in the form of the zoom axicon system described above with reference to FIG. 6 is illustrated in a greatly simplified manner as a simple lens element with "205".

Figure 2B:
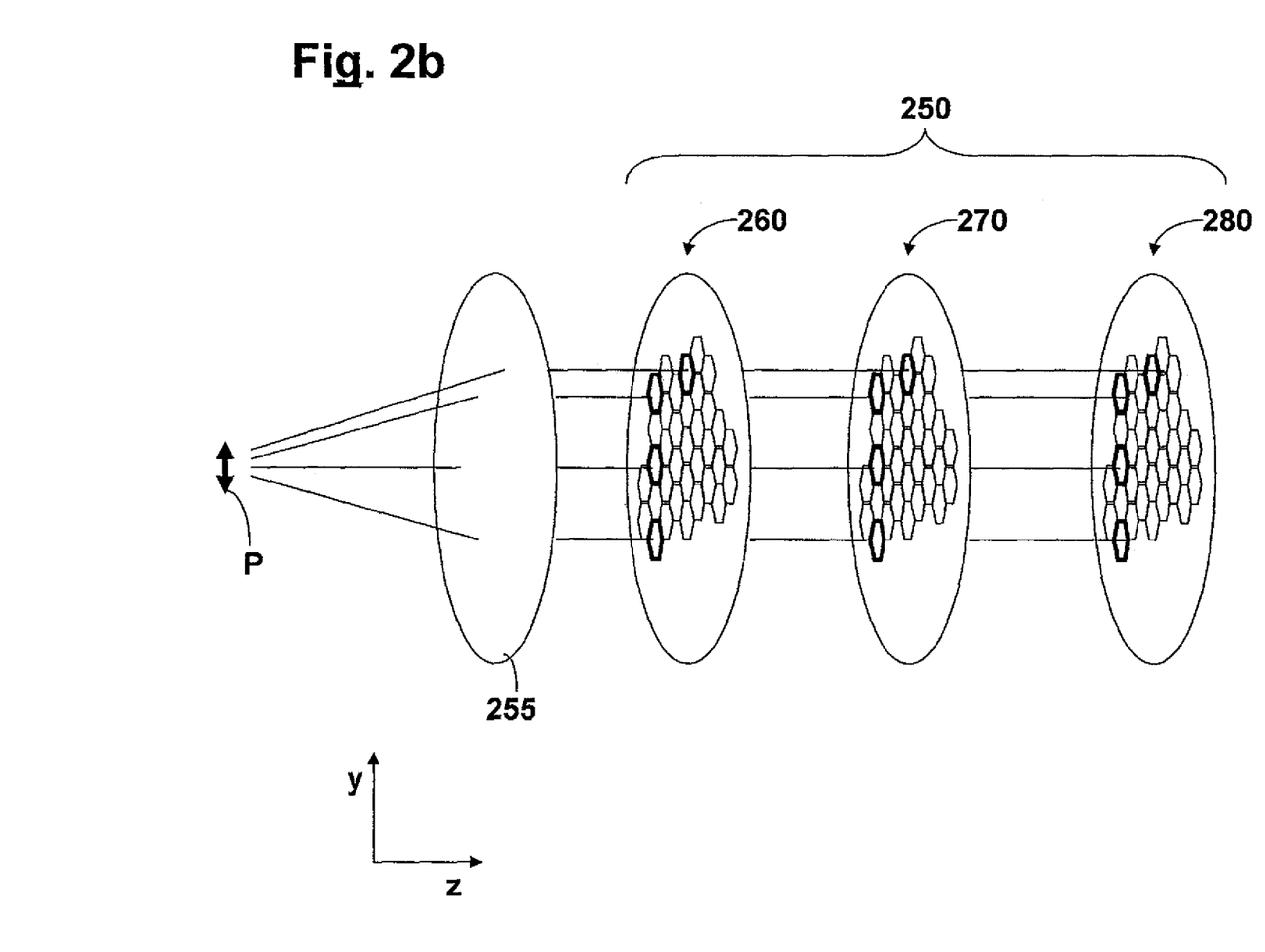

In further embodiments, in accordance with FIG. 2b, a polarization-influencing optical arrangement 250 can also comprise three (or more) arrays 260, 270, 280 of polarization-influencing elements. A configuration comprising three arrays 260, 270, 280 of polarization-influencing elements can be advantageous for example when the direction of polarization of the illumination light is already rotated upon entry in the illumination device (e.g. still upstream of the DOE 606 in FIG. 6).

Figure 3:
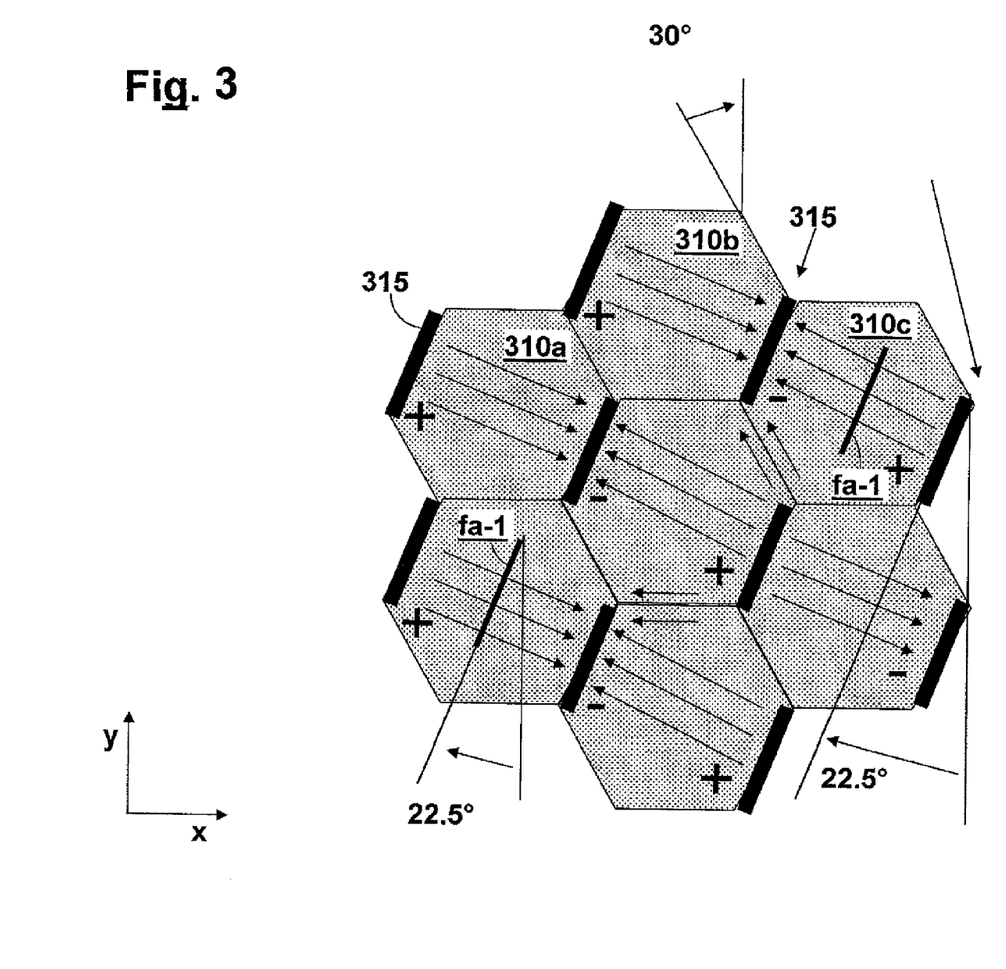

As can be seen from FIG. 3, the individual polarization-influencing elements or Pockels cells 310a, 310b, 310c, . . . within one and the same array can be provided in each case with an identical orientation of the electric field or of the fast axis of the birefringence that is induced thereby for example by virtue of the fact that the electrodes 315 within the respective array are alternately switched or have voltage applied to them, that is to say that the polarity of the voltage of successive electrodes 315 changes along the Pockels cells 310b, 310c, . . . that are adjacent in the arrow direction.

As likewise indicated in FIG. 3, in the case of the hexagonal geometry of the array chosen in the exemplary embodiment, the electrodes 315 (which are arranged at angles of ±22.5° with respect to the preferred direction of polarization of the impinging light or with respect to the y-direction) run to a first approximation parallel to the sides of the individual Pockels cells 310a, 310b, 310c, . . . (i.e. form only a small angle of a few degrees with them), since in the hexagonal arrangement of FIG. 3 the sides of the individual Pockels cells 310a, 310b, 310c, . . . that are inclined relative to the y-direction run in each case at an angle of 30° with respect to the y-direction. With such an orientation of the electrodes 315 it is possible, as already described with reference to FIG. 2a, to set different polarization states in a particularly advantageous manner (namely in a "45° quantization", in which the polarization rotation angles produced are in each case an integral multiple of 45°), which polarization states in turn allow the conversion of a constantly linear input polarization into a quasi-tangential polarization distribution or a quasi-radial polarization distribution.

Figure 4:
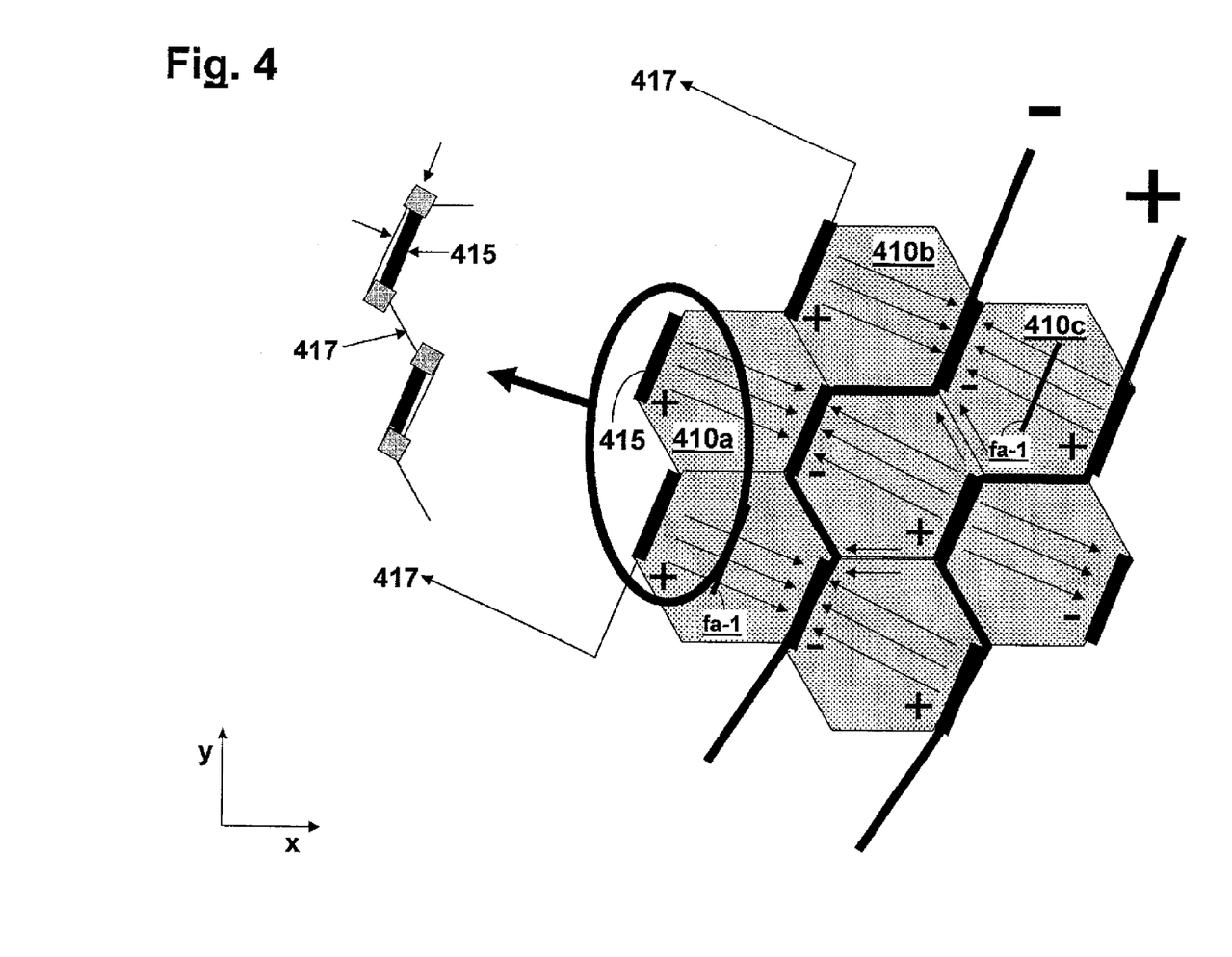

Voltage is applied to the electrodes in the polarization-influencing optical arrangement itself preferably, as illustrated schematically in FIG. 4, with screening of the electric field in the region of the electric leads (designated by "417" in FIG. 4), such that the electric field in the respective Pockels cell 410a, 410b, 410c, . . . is brought about solely by the electrodes 415 themselves. For this purpose, in particular the electrical leads 417, which can be guided along e.g. in remaining interspaces between adjacent Pockels cells 410a, 410b, 410c, . . . can be configured as coaxial cables in order to obtain a sufficient screening. In further embodiments, the electrical leads 417 can in each case also be "paired" such that the electric far field falls rapidly and therefore has no significant disturbing influence on the Pockels cells 410a, 410b, 410c, . . . .

Figure 5:
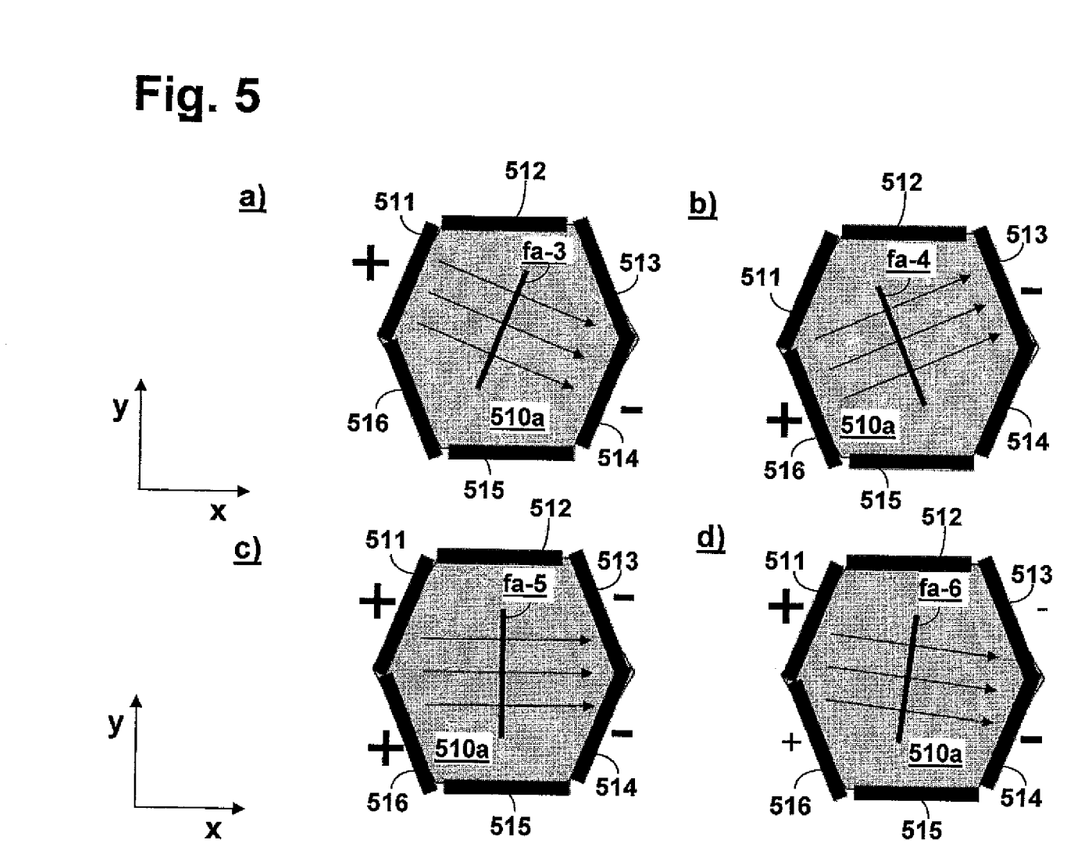

In accordance with a further embodiment, illustrated in FIG. 5a-d, for the individual Pockels cells 510a, . . . electrodes 511-516 are arranged at more than only two mutually opposite sides (at all six sides in the example illustrated), such that, via correspondingly varying application of voltage to the electrodes 511-516, firstly (as indicated in FIGS. 5a and 5b) it is possible to change over between different orientations of the electric field or of the induced fast axis of the birefringence. Secondly, it is also possible (as indicated in FIGS. 5c and 5d) for electrical voltages having identical magnitudes or having different magnitudes to be applied to a plurality of pairs of mutually opposite sides of the Pockels cell 510a, which in turn at least approximately makes it possible to rotate the orientation of the electric field or of the induced fast axis of the birefringence continuously by way of the respectively resulting electrical voltage present at the respective Pockels cell 510a, as is indicated in FIG. 5 via respectively differently oriented fast axes "fa-3", "fa-4", "fa-5" and "fa-6".

Even though the invention has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An optical system, comprising:
   a polarization influencing optical arrangement, comprising:
      a first array comprising first transverse Pockels cells;
      a second array comprising second transverse Pockels cells; and
      a plurality of electrodes configured to generate an electric field, wherein:
         the first and second arrays are arranged successively in a direction that light propagates through the system during use of the system;
         the first transverse Pockels cells have an electric-field dependent birefringence;
         the second transverse Pockels cells have an electric-field dependent birefringence;
         the electrodes are in each case arranged on mutually opposite sides of the first transverse Pockels cells and of the second transverse Pockels cells;
         the electrodes arranged on the first array are oriented at a non-zero angle relative to the electrodes arranged on the second array; and
         the optical system is a microlithographic optical system.

2. The optical system of claim 1, wherein the electrodes are configured as a plurality of electrode pairs, wherein each transverse Pockels cell has at least two corresponding electrode pairs assigned to different pairs of mutually opposite sides of the cell.

3. The optical system of claim 2, wherein the electrode pairs are configured so that, for each electrode pair, an electrical voltage is applicable to the electrode independently of a different electrode pair.

4. The optical system of claim 1, wherein fast axes of the birefringence inducible in the first transverse Pockels cells are oriented at a non-zero angle with respect to fast axes of the birefringence that are induceable in the second transverse Pockels cells.

5. The optical system of claim 4, wherein the angle is 45°±5°.

6. The optical system of claim 1, wherein the first transverse Pockels cells are in a hexagonal arrangement.

7. The optical system of claim 6, wherein the second transverse Pockels cells are in a hexagonal arrangement.

8. The optical system of claim 1, wherein the polarization-influencing optical arrangement is arranged in a pupil plane of the optical system.

9. The optical system of claim 1, wherein, for each of a multiplicity of channels running through the arrangement, the polarization influencing optical arrangement is configured to produce different polarization rotation angles for linearly polarized light passing through a respective channel, in a manner dependent on whether or not a predefined electrical voltage is present at the transverse Pockels cell situated in the region of the respective channel.

10. The optical system of claim 9, wherein the polarization rotation angles are in each case an integral multiple of 45°.

11. The optical system of claim 1, wherein the optical system is configured so that during use of the system, by selectively applying a predefined electrical voltage to the transverse Pockels cells, a constantly linear polarization distribution of light passing through the optical system is converted into a quasi-tangential or quasi-radial polarization distribution.

12. The optical system of claim 1, further comprising a diffractive optical element.

13. The optical system of claim 1, further comprising a third array comprising third transverse Pockels cells.

14. The optical system of claim 1, wherein the optical system is a microlithographic illumination device.

15. The optical system of claim 1, wherein the electrodes are configured as a plurality of pairs of electrodes, each pair of electrodes being arranged on opposite sides of a corresponding Pockels cell so that, during use of the optical system, the electrode pair generates an electric field across the corresponding Pockels cell.

16. An apparatus, comprising:
   an illumination device comprising an optical system according to claim 1; and
   a projection lens,
   wherein the apparatus is a microlithographic projection exposure apparatus.

17. A method of using a microlithographic projection exposure apparatus comprising an illumination device and a projection lens, the method comprising:
   using the illumination device to illuminate an object in an object field; and
   using the projection lens to project an image of the object into an image field,
   wherein the illumination device comprises an optical system according to claim 1.

* * * * *

UNITED STATES PATENT AND TRADEMARK OFFICE
CERTIFICATE OF CORRECTION

PATENT NO. : 9,442,385 B2  
APPLICATION NO. : 14/297375  
DATED : September 13, 2016  
INVENTOR(S) : Ingo Saenger and Frank Schlesener Page 1 of 1

It is certified that error appears in the above-identified patent and that said Letters Patent is hereby corrected as shown below:

On the Title Page

Column 2, Line 10, under "ABSTRACT", delete "propogation" and insert -- propagation --.

In the Specification

Column 2, Line 6, delete "propogation" and insert -- propagation --.

Column 3, Line 34, delete "propogation" and insert -- propagation --.

In the Claims

Column 9, Line 41, Claim 4, delete "induceable" and insert -- inducible --.

Signed and Sealed this  
Eighteenth Day of April, 2017

Michelle K. Lee  
*Director of the United States Patent and Trademark Office*